Sept. 29, 1970 J. AVINS 3,531,657
INTEGRATED CIRCUIT AMPLIFIER BIASING ARRANGEMENT
Filed Feb. 29, 1968
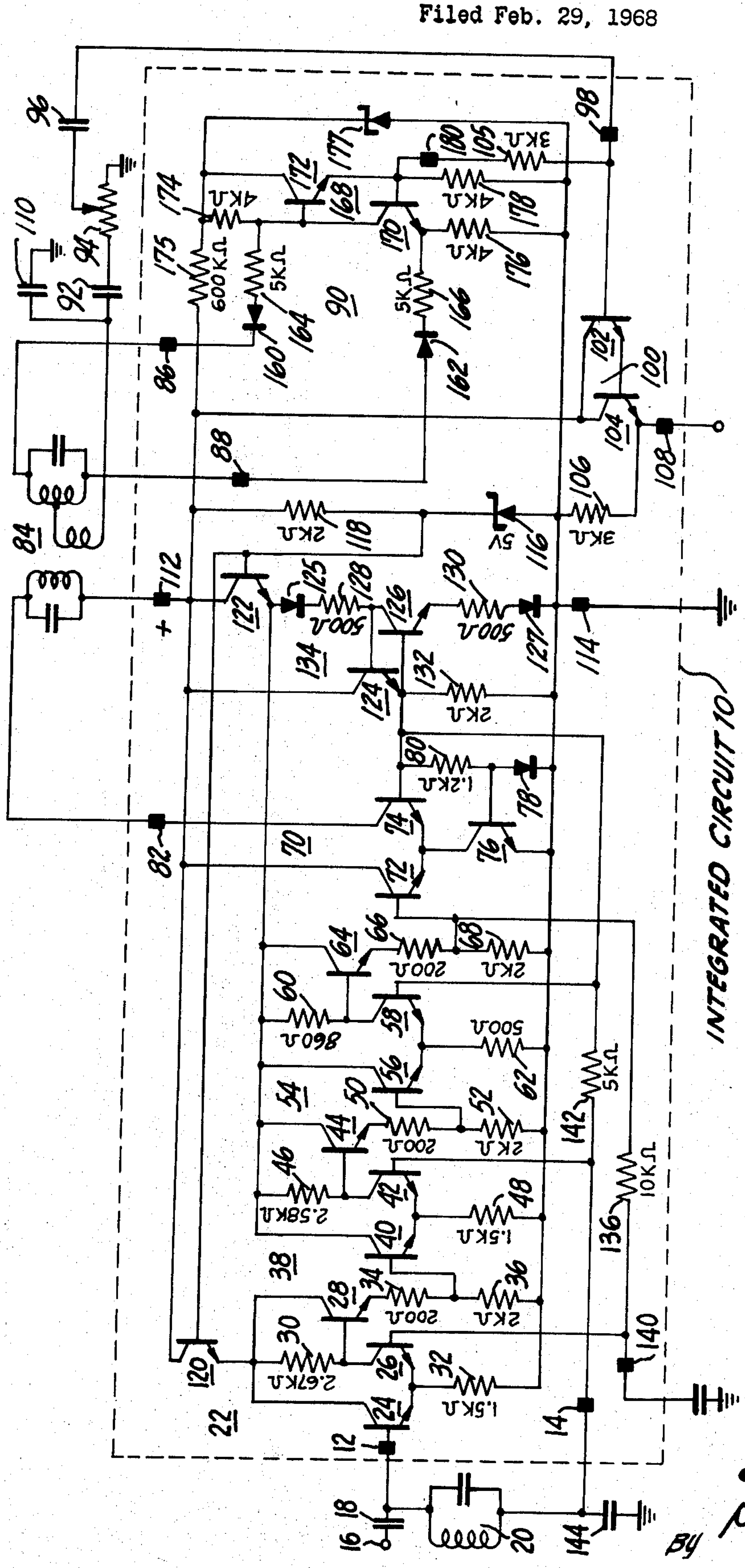
INVENTOR
JACK AVINS
BY Charles Brodsky
ATTORNEY 3,531,657

INTEGRATED CIRCUIT AMPLIFIER BIASING ARRANGEMENT

Jack Avins, Princeton, N.J., assignor to RCA Corporation, a corporation of Delaware Filed Feb. 29, 1968, Ser. No. 709,335
Int. Cl. H03k *5/08;* H03f *3/04*
U.S. Cl. 307—237 8 Claims

ABSTRACT OF THE DISCLOSURE

A pair of resistors are provided for use in an integrated circuit amplifier configuration of the type having a plurality of cascade-connected transistor stages, each of which includes an emitter-coupled amplifier driving an emitter follower. The first of the resistors serves to couple a bias voltage to one of the emitter-coupled transistors in each of the first and second stages of the cascade-connected plurality, and the second of the resistors serves to couple a feedback voltage to the other of the emitter-coupled transistors in the first cascaded stage, the resistors being so proportioned that substantially equal direct current voltage drops are developed across the one as is developed across the other.

This invention relates to electrical circuits, in general, and to biasing arrangements for integrated circuits, in particular. As used herein, the term integrated circuit refers to a unitary or monolithic semiconductor device or chip which is the equivalent of a network of interconnected active and passive circuit elements.

In accordance with the invention, there is provided a pair of resistors for use in an integrated circuit amplifier configuration of the type having a plurality of cascade-connected transistor stages. Each stage includes an emitter-coupled amplifier pair driving an emitter follower, with the first of the resistors serving to couple a bias voltage to one of the emitter-coupled transistor pair in each of the first and second stages and with the second of the resistors serving to couple a feedback voltage to the other of the emitter-coupled pair in the first cascaded stage. The resistors are so proportioned that substantially equal direct current (D.C.) voltage drops are developed across the one as is developed across the other.

As will become clear hereinafter, in an angle modulated wave processing channel embodiment including the invention, the first mentioned resistor is selected to be one-half the value of the second resistor. Such an arrangement allows for symmetrical biasing of the limiter stage which precedes the discriminator circuit of the channel, and ensures that symmetrical limiting and balanced frequency detection will take place. Such an arrangement also permits a cost savings, in that, with it, a normally employed bypass capacitor may be eliminated. When the processing channel is included in an integrated circuit environment, furthermore, the two-to-one resistance ratio also permits a savings of the one of the limited number of external terminals on the integrated chip which is used to couple the bypass capacitor to the semiconductor body.

The novel features which are considered to be characteristic of this invention are set forth with particularity in the appended claims. The invention itself, however, both as to its organization and method of operation as well as additional objects and advantages thereof, will best be understood from the following description when read in connection with the single figure of the drawing which represents a schematic circuit diagram of an angle modulated wave processing channel for frequency modulated receivers which may be incorporated in an integrated circuit device. It is to be understood, however, that the fundamental concepts to be described are more generally applicable. The invention, for example, may be used in conjunction with any amplifier configuration having a plurality of cascade-connected transistor stages of the basic type herein described.

The schematic circuit diagram of the drawing shows the use of multiple three transistor amplifier stages in the intermediate frequency amplifier of the FM radio receiver. The dotted box 10 schematically illustrates a monolithic semiconductor circuit chip. The chip has a plurality of contact areas about the periphery thereof, through which connections to the circuit on the chip may be made. For example, the chip 10 has a pair of contact areas 12 and 14 which are coupled to a source of FM waves. As to physical dimensions, the chip 10 may be of the order of 60 mils x 60 mils, or smaller. The manner of implementing the various transistor, diode and resistor functional portions described below in a monolithic chip is known in the art.

Frequency modulated signals from a suitable source, such as the mixer stage of the FM radio receiver, are applied between terminal 16 and ground, and are coupled through a capacitor 18 to a resonant circuit 20 which is tuned to the 10.7 mHz. intermediate frequency signal. The resonant circuit 20 and the coupling capacitor 18, in the present example, are external to the chip but are coupled thereto through the contact areas 12 and 14.

The contact area 12 is directly coupled to a first amplifier stage 22 including three transistors 24, 26 and 28. The first two transistors 24 and 26 are connected by resistors 30 and 32 to provide an emitter coupled amplifier, and the third transistor 28 is connected by resistors 34 and 36 as an emitter follower. The amplifier stage 22 is shown as being of the type described in the pending application Ser. No. 650,088, filed June 29, 1967, now Pat. No. 3,467,909, and entitled Integrated Amplifier Circuit Especially Suited for High Frequency Operation. The output signal developed by the amplifier stage 22 appears at the junction of resistors 34 and 36.

The amplifier stage 22 is directly coupled to a similar amplifier stage 38 which also includes three transistors 40, 42 and 44. The first two transistors 40 and 42 are also connected by a pair of resistors 46 and 48 to form the emitter coupled amplifier construction, while the third transistor 44 is also connected as an emitter follower, by resistors 50 and 52. The output signal from this stage is developed at the junction of resistors 50 and 52.

The amplifier stage 38 is directly coupled to a similar such stage 54. The emitter coupled amplifier of the stage 54 includes the transistors 56 and 58, the load resistor 60 and the common emitter resistor 62. The emitter follower includes the transistor 64 and the serially connected resistors 66 and 68, the junction of which comprises the output point of the amplifier stage 54.

Output signals from the stage 54 are developed across the resistor 68 and applied to a high level limiter stage 70 including transistors 72, 74 and 76, a diode 78 and a resistor 80. The transistor 76 functions as a constant current source for the limiter stage 70, and is temperature compensated by the diode 78 in a known manner. The transistor 74 portion of the stage 70 is connected through a contact area 82 to drive the primary winding of a discriminator transformer 84. The secondary winding of the discriminator transformer 84 is connected through a pair of contact areas 86 and 88 to the remainder of the discriminator circuit 90.

The discriminator circuit 90 is of the type described in the pending application entitled, Signal Translating And Angle Demodulating System, Ser. No. 700,131, filed Jan. 31, 1968. More particularly, the circuit 90 is of the form of a ratio detector but without the large non-integratable capacitor normally used to obtain peak rectification. The oppositely poled rectifier devices of the discriminator circuit 90 are shown by the reference numerals 160 and 162 while the distributed capacitance of the integrated load resistors 164 and 166 provide filtering of the signal frequency and its harmonics. A unique biasing circuit 168, including transistors 170 and 172 and resistors 174, 176 and 178, the first two being of substantially the same resistance value, serves to forward bias the rectifier devices 160 and 162 so as to maintain balanced, linear operation in the presence of low level signals and increases in environmental temperature. With a Zener diode 177 connected between the collector electrode of transistor 172 and a contact area 114, and with the component values shown in the drawing, a quiescent D-C potential of approximately +2.5 volts is developed at the contact area 180, and serves as a reference potential for the discriminator 90.

The demodulated signals developed by the discriminator 90 are coupled by means of the tertiary winding of the discriminator transformer 84, a first capacitor 92, a volume control potentiometer 94, a second capacitor 96 and a contact area 98 to the input of an audio frequency amplifier stage 100, including transistors 102 and 104 and resistors 105 and 106. Output signals from the stage 100 are developed across resistor 106 and may be taken from the semiconductor chip through a contact area 108. A de-emphasis capacitor 110 is coupled between a point of ground potential and the junction between the tertiary winding and the capacitor 92.

The positive terminal of a D-C supply source for the circuit (which may be subject to some variation) is connected to a contact area 112, while the grounded negative terminal is connected to another contact area 114. The unregulated voltage between the contact areas 112 and 114 is directly applied to the transistor 72 of the high level stage 70 and to the transistors 102 and 104 of the audio frequency amplifier stage 100.

The supply voltage variation is regulated by a Zener diode 116, which is connected between the contact areas 112 and 114 via a resistor 118. Transistors 120 and 122, connected to the contact area 112 and to the Zener diode 116, serve as emitter followers to isolate the regulated voltage fed to the amplifier stage 22 from that fed to the stages 38 and 54.

A pair of transistors 124 and 126, a pair of rectifiers 125 and 127, and three resistors 128, 130 and 132 are also included in the circuit of the drawing, and comprise a bias potential supply 134 for the amplifier stages 22, 38 and 54. This supply 134 is of the type disclosed in the pending application Ser. No. 709,274, filed Feb. 29, 1968, and entitled Integrated Circuit Biasing Arrangements. In a manner analogous to that described therein, the supply 134 develops a voltage across the resistor 132 which is substantially equal to one-half the value of the supply voltage at the anode of rectifier 125 remote from the collector electrode of transistor 126, and which is independent of temperature and supply voltage variations. Operating point stability of the amplifier stages 22, 38 and 54 is maintained by use of direct current feedback through a resistor 136 around those three stages, with a bypass capacitor 138 connected to the resistor 136 via a contact area 140. The limiter stage 70 is then held automatically at the proper operating point because the feedback around the amplifier stages 22, 38 and 54 holds the voltage at the base electrode of the transistor 72 at one-half the aforementioned supply voltage. The limiter stage 70 is thus balanced without being in the feedback loop. This is desirable because the tendency towards oscillation in the feedback loop is reduced by keeping the number of stages as low as possible. Proper bias voltage for the limiter stage 70 is made essentially independent of transistor current gain through the use of a resistor 142, connected in the base electrode returns of transistors 24 and 42 and substantially equal in value to one-half the resistance of the resistor 136 connected in the base electrode return of transistor 26. Bypass capacitor 144 is connected to the resistor 142 by means of the contact area 14.

Proper bias voltage for the limiter stage 54 can also be made essentially independent of transistor gain by alternatively connecting the bias resistor 142 between the base electrode of transistor 42 and the contact area 14, and by doubling its resistance to substantially equal that of the feedback resistor 136. By connecting the resistor 142 in this manner, however, a further capacitor would have to be added to the circuit in order to bypass the base electrode of transistor 42 to ground. This is due to the unavoidable presence of some radio frequency ripple at the output of the bias potential supply 134, even though the voltage there developed is from a very low output impedance. In view of the gain provided by the amplifier stage of the configuration, 90 db from input to output, this ripple must be prevented from reaching the most critical stages 22 and 38, else the amplifier would tend to undesirably oscillate. The capacitor 144 effectively bypasses the transistor 24 and, therefore, the stage 22, while the added capacitor in this alternative arrangement, would bypass the transistor 42 and the amplifier stage 38. (It will be appreciated that the amplifier stage 54 is far less critical in providing the overall gain and the effect of the radio frequency ripple at the base electrode of the transistor 58 therein is fairly insignificant in the circuit operation.)

It will be evident, though, that this alternative scheme increases the cost of the angle modulated wave processing channel, due to the cost of the additional bypass capacitor. It will also be evident that an additional terminal or contact area on the integrated circuit chip must be set aside in order to couple that capacitor to the amplifier stage 38. This may create some difficulty since, as is well known, there is a limited number of available terminals on an integrated chip for external connection.

With the arrangement shown in the drawing, however, both these disadvantages are obviated. That is, by connecting the resistor 142 between the base electrodes of the transistors 42 and 58, as shown, the capacitor 144 now serves to bypass the base electrode of transistor 24 and, also, the corresponding electrode of transistor 42. The cost of the additional bypass capacitor is thus saved and no need exists to use an extra contact area to connect that capacitor to the chip. To insure that the limiter transistors 72 and 74 will be symmetrically biased, it also becomes necessary that the D-C voltage drops developed across the resistors 136 and 142 will be substantially equal. By selecting the base-bias resistor 142 to be one-half the value of the feedback resistor 136, this condition will be met since substantially equal currents flow in the amplifier stages 22 and 38. Symmetrical limiting will thus be assured in the above-described construction.

With the resulting circuit arrangement shown in the drawing, balanced detection will be maintained, even for low level signal operation. The audio frequency output signal is taken from the tertiary of the discriminator transformer and is centered at the +2.5 volt reference potential. Since the right hand end of resistor 164 is at a potential approximately 0.7 volt greater than the +2.5 volt reference potential existing at the contact area 180, due to the forward drop of the base-emitter junction of transistor 172, it will be apparent that negative going signal swings of even very small amounts will be sufficient to forward bias rectifier 160 and cause conduction to occur. Similarly, since the right hand end of resistor 166 is at a potential 0.7 volt below the +2.5 volt reference potential, due to the drop of the base-emitter junction of transistor 170, positive going signal swings of very small amount will be sufficient to overcome the "contact" potential of rectifier 162 and bias it into conduction. The balanced detection will thus be maintained even for low level signals since the "contact" potentials will be overcome as soon as input signals are applied.

The balance detection provided will also be maintained in the presence of environmental temperature variations, particularly those resulting from heat generation. Thus, as the temperature increases and the base-to-emitter $V_{be}$ voltages of the forward biased junctions decrease, it will be seen that the fall in the collector potential of the transistor 170 due to the decreasing $V_{be}$ voltage of the transistor will be exactly offset by the corresponding $V_{be}$ decrease of transistor 172, the gain for the transistor 170 stage being unity. The +2.5 volt reference potential at the emitter electrode of transistor 172, and at the contact area 180, will therefore be maintained. The coupling rectifiers 160 and 162 will continue to be forward biased by the circuit 168, furthermore, since the decreasing $V_{be}$ drops of the transistors 170 and 172 will be matched by the decreasing "contact" potential of those devices.

What is claimed is:

1. The combination comprising:

a plurality of cascade-connected transistor stages, each including an emitter-coupled amplifier driving an emitter follower amplifier;

a bias voltage supply;

a first resistor coupling said bias supply to one of the emitter-coupled transistors in each of the first and second stages of said cascade-connected plurality; and a second resistor coupling a feedback voltage from the emitter follower transistor of the last stage of said cascade-connected plurality to the other of the emitter-coupled transistors in said first cascade stage;

the resistance values of said first and second resistors being such that substantially equal direct current voltage drops are developed across said first resistor as is developed across said second resistor.

2. The combination as defined in claim 1 wherein the resistance value of said first resistor is substantially one-half the resistance value of said second resistor.

3. The combination a defined in claim 2 wherein said plurality of cascade-connected stages, said bias voltage supply and said first and second resistors are all disposed in a single integrated circuit.

4. The combination as defined in claim 1 wherein there is further included direct current coupling means connecting said bias voltage supply to the emitter coupled transistor of the remaining stages of said cascade-connected plurality corresponding to the emitter coupled transistor of said second cascaded stage which is connected to said bias supply by said first resistor.

5. The combination as defined in claim 4 wherein each cascaded stage of said plurality includes:

first, second and third transistors having base, emitter and collector electrodes;

means including a first and a second resistor connecting said first and second transistors as an emitter-coupled amplifier, with said first resistor of said stage connected in common with the emitter electrodes of said first and second transistors, and with said second resistor of said stage connected in the collector electrode circuit of said second transistor;

means including a third resistor connecting said third transistor as an emitter follower circuit;

means providing a direct current connection for applying signals from said emitter-coupled amplifier circuit to said emitter follower circuit; and output circuit means coupled to said third resistor at a point thereon which is at the same direct potential as is applied to the base electrode of said first transistor.

6. The combination as defined in claim 5 wherein said bias supply includes:

a source of energizing potential;

first and second transistors, each having base, emitter and collector electrodes;

means including third and fourth resistors connecting said first transistor to said source of energizing potential in a degenerated common emitter configuration;

means including a fifth resistor connecting said second transistor to said source in a common collector configuration;

means coupling the collector electrode of said first transistor to the base electrode of said second transistor; and means coupling the base electrode of said first transistor to the emitter electrode of said second transistor and to said first resistor coupling said bias supply to said one of the emitter-coupled transistors in each of the first and second stages of said cascade-connected plurality.

7. The combination as defined in claim 6 wherein said third and fourth resistors are of substantially the same resistance value and wherein there is further included first and second rectifiers serially connected with said third and fourth resistors, respectively, and poled in the direction of majority current flow through said first transistor.

8. The combination comprising:

a limiter stage including first and second emitter coupled transistors;

a plurality of cascade-connected amplifier stages, the output of which is coupled to said first emitter coupled transistor to provide the signal drive for said limiter stage;

a source of direct potential coupled to said second emitter coupled transistor to provide a bias voltage for said limiter;

a first resistor coupling said potential source to at least the first two amplifier stages of said cascade connected plurality to provide a bias voltage therefor;

and a second resistor coupling said first emitter coupled transistor to said first amplifier stage to provide a stabilizing feedback voltage for said plurality;

the resistance values of said first and second resistors being such that substantially equal direct current voltage drops are developed across said first resistor as is developed across said second resistor, so that input signals applied to said first amplifier stage are amplified thereby and by the remaining stages of said cascade-connected plurality and are symmetrically limited by said limiter stage.

References Cited

UNITED STATES PATENTS 3,467,909 9/1969 Avins et al. -------- 330—38 X

ROY LAKE, Primary Examiner

J. B. MULLINS, Assistant Examiner

U.S. Cl. X.R.

330—20, 22, 25